(12) United States Patent
Han et al.

(10) Patent No.: US 11,145,603 B2
(45) Date of Patent: Oct. 12, 2021

(54) INTEGRATED CIRCUIT PACKAGING SYSTEM WITH SHIELDING AND METHOD OF MANUFACTURE THEREOF

(71) Applicant: STATS ChipPAC Pte. Ltd., Singapore (SG)

(72) Inventors: Byung Joon Han, Singapore (SG); Il Kwon Shim, Singapore (SG); KyoungHee Park, Seoul (KR); Yaojian Lin, Singapore (SG); KyoWang Koo, Incheon-si (KR); In Sang Yoon, Seoul (KR); SeungYong Chai, Incheon (KR); SungWon Cho, Seoul (KR); SungSoo Kim, Seoul (KR); Hun Teak Lee, Seongnam-si (KR); DeokKyung Yang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 5 days.

(21) Appl. No.: 16/005,387

(22) Filed: Jun. 11, 2018

(65) Prior Publication Data

US 2018/0294236 A1    Oct. 11, 2018

Related U.S. Application Data

(63) Continuation of application No. 15/091,049, filed on Apr. 5, 2016, now Pat. No. 9,997,468.
(Continued)

(51) Int. Cl.
*H01L 23/00* (2006.01)
*H01L 23/552* (2006.01)
(Continued)

(52) U.S. Cl.
CPC .......... *H01L 23/552* (2013.01); *H01L 21/486* (2013.01); *H01L 21/6835* (2013.01);
(Continued)

(58) Field of Classification Search
None
See application file for complete search history.

(56) References Cited

U.S. PATENT DOCUMENTS

| 6,144,090 A | 11/2000 | Higashiguchi |
| 8,236,612 B2 | 8/2012 | Antonio et al. |

(Continued)

FOREIGN PATENT DOCUMENTS

| CN | 101300911 A | 11/2008 |
| CN | 101567328 B | 4/2011 |
| CN | 102064141 A | 5/2011 |

OTHER PUBLICATIONS

U.S. Appl. No. 15/091,049, Advisory Action dated Aug. 18, 2017.
U.S. Appl. No. 15/091,049, Final Office Action dated Jun. 6, 2017.
U.S. Appl. No. 15/091,049, Non-Final Office Action dated Nov. 1, 2016.
U.S. Appl. No. 15/091,049, Notice of Allowance dated Feb. 2, 2018.
Taiwan Patent Office, Application No. 105110868, Foreign Office Action dated Sep. 19, 2019.
(Continued)

*Primary Examiner* — Hrayr A Sayadian
(74) *Attorney, Agent, or Firm* — Wong & Rees LLP

(57) ABSTRACT

An integrated circuit packaging system and method of manufacture thereof includes: a substrate with internal circuitry between a substrate top side, a substrate bottom side, and vertical sides; an integrated circuit coupled to the internal circuitry; a molded package body formed directly on the integrated circuit and the substrate top side of the substrate; and a conductive conformal shield structure applied directly on the molded package body, the vertical sides, and to extend below the substrate bottom side coupled to the internal circuitry.

16 Claims, 9 Drawing Sheets

Related U.S. Application Data

(60) Provisional application No. 62/146,209, filed on Apr. 10, 2015.

(51) Int. Cl.
*H01L 23/498* (2006.01)
*H01L 21/48* (2006.01)
*H01L 21/683* (2006.01)
*H01L 23/31* (2006.01)
*H01L 25/16* (2006.01)
*H01L 21/56* (2006.01)

(52) U.S. Cl.
CPC .... *H01L 21/6836* (2013.01); *H01L 23/49827* (2013.01); *H01L 23/49838* (2013.01); *H01L 24/97* (2013.01); *H01L 21/561* (2013.01); *H01L 23/3114* (2013.01); *H01L 23/49805* (2013.01); *H01L 23/49816* (2013.01); *H01L 23/49894* (2013.01); *H01L 24/13* (2013.01); *H01L 24/16* (2013.01); *H01L 25/16* (2013.01); *H01L 2221/68327* (2013.01); *H01L 2224/13111* (2013.01); *H01L 2224/16227* (2013.01); *H01L 2224/97* (2013.01); *H01L 2924/141* (2013.01); *H01L 2924/143* (2013.01); *H01L 2924/1434* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(56) References Cited

U.S. PATENT DOCUMENTS

| | | | |
|---|---|---|---|
| 8,378,466 | B2 | 2/2013 | Chiu et al. |
| 8,766,416 | B2 | 7/2014 | Hsu et al. |
| 9,997,468 | B2 * | 6/2018 | Han .................. H01L 21/6836 |
| 2003/0000738 | A1 * | 1/2003 | Rumsey .................. B33Y 10/00 |
| | | | 174/260 |
| 2009/0294928 | A1 | 12/2009 | Kim et al. |
| 2009/0302435 | A1 | 12/2009 | Pagaila et al. |
| 2011/0115059 | A1 | 5/2011 | Lee et al. |
| 2011/0298111 | A1 | 12/2011 | Kim |
| 2012/0228751 | A1 | 9/2012 | Song |
| 2014/0028518 | A1 | 1/2014 | Arnold et al. |
| 2014/0367160 | A1 | 12/2014 | Yu et al. |
| 2015/0156864 | A1 | 6/2015 | Kobayashi |
| 2015/0235966 | A1 | 8/2015 | Ohhashi |
| 2016/0268213 | A1 | 9/2016 | Jiang et al. |
| 2016/0293833 | A1 | 10/2016 | Otsuka |
| 2016/0300799 | A1 | 10/2016 | Han et al. |
| 2018/0294235 | A1 | 10/2018 | Han et al. |

OTHER PUBLICATIONS

Chinese Patent Office, Application No. 201610218946.4, Foreign Office Action dated Sep. 2, 2019.
Chinese Patent Office, Application No. 201610218946.4, Foreign Office Action dated Jun. 1, 2020.
U.S. Appl. No. 16/005,348, Non-Final Office Action dated Apr. 20, 2020.

* cited by examiner

INTEGRATED CIRCUIT PACKAGING SYSTEM WITH SHIELDING AND METHOD OF MANUFACTURE THEREOF

CROSS-REFERENCE TO RELATED APPLICATION(S)

This application claims priority as a Continuation of U.S. application Ser. No. 15/091,049, filed Apr. 5, 2016, which claims the benefit under 35 U.S.C. § 119(e) of U.S. Provisional Application Ser. No. 62/146,209 filed Apr. 10, 2015. The entire contents of the aforementioned are hereby incorporated by reference as if fully set forth herein, under 35 U.S.C. § 120. The applicant(s) hereby rescind any disclaimer of claim scope in the parent application(s) or the prosecution history thereof and advise the USPTO that the claims in this application may be broader than any claim in the parent application(s).

TECHNICAL FIELD

The present invention relates generally to an integrated circuit packaging system, and more particularly to a system for packaging integrated circuit die with electro-magnetic interference shielding.

BACKGROUND ART

Electronic products have become an integral part of our daily lives. Packages of components such as semiconductor circuits, transistors, diodes, and other electronic devices have become smaller and thinner with more function and connections. In packaging components, the need for shielding components from outside electro-magnetic interference in a reliable manner can influence the manufacturing processes.

The commercial demand for more function in less space can cause manufacturers to make components that are mounted extremely close together. The linking of electromagnetic fields can impact the reliable operation of these components. The requirement of providing an electro-magnetic shield on components can add cost and reduce manufacturing yield of the components. The additional pressure of cost reductions can pressure manufacturers to make compromises that can reduce the long term reliability of the integrated circuit products.

Thus, a need still remains for an integrated circuit packaging system with shielding that can reduce package size, support increased function, and maintain both manufacturing yield and long term reliability. In view of the extensive commercial pressures for high volume, small size, and reliability, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate with internal circuitry between a substrate top side, a substrate bottom side, and vertical sides; coupling an integrated circuit to the internal circuitry; forming a molded package body directly on the integrated circuit and the substrate top side of the substrate; and applying a conductive conformal shield structure directly on the molded package body, the vertical sides, and extending below the substrate bottom side for coupling the internal circuitry.

The present invention provides an integrated circuit packaging system, including: a substrate with internal circuitry between a substrate top side, a substrate bottom side, and vertical sides; an integrated circuit coupled to the internal circuitry; a molded package body formed directly on the integrated circuit and the substrate top side of the substrate; and a conductive conformal shield structure applied directly on the molded package body, the vertical sides, and to extend below the substrate bottom side coupled to the internal circuitry.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
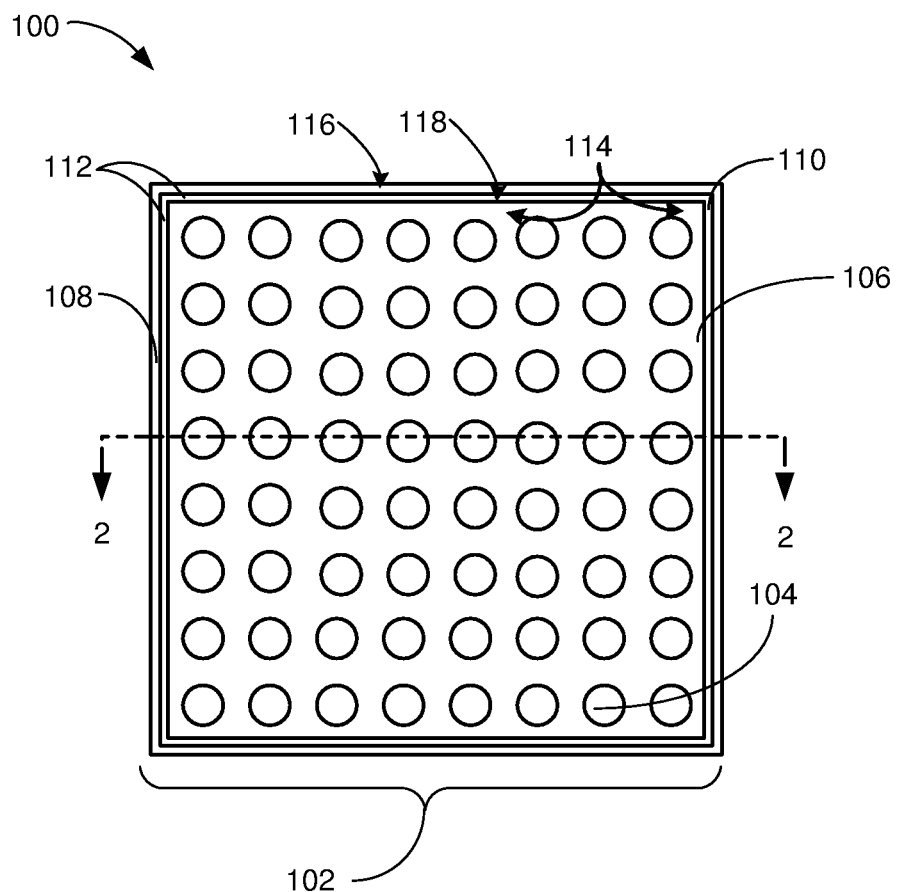
FIG. 1 is a bottom view of a first embodiment of an integrated circuit packaging system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means there is direct physical contact between elements with no intervening elements.

The term "processing" as used herein includes deposition of material or photoresist, patterning, exposure, development, etching, cleaning, and/or removal of the material or photoresist as required in forming a described structure. The term "abut" means to contact or press against an object or structure.

Referring now to FIG. 1, therein is shown a bottom view of a first embodiment of an integrated circuit packaging system 100. The bottom view of the first embodiment of the integrated circuit packaging system 100 depicts an integrated circuit package 102 having an array of system interconnects 104, mounted in contact with a solder resist layer 106, and a conductive conformal shield structure 108 exposed in a peripheral region of the integrated circuit package 102. The solder resist layer 106 can be a polymer film, epoxy layer, plastic coating, or the like. It is understood that the integrated circuit package 102 can be any type of package structure, including a wafer level package (WLP), a single integrated circuit package, a multi-chip package, an integrated passive device (IPD), a package-in-package, a package-on-package, or a multi-technology package. The solder resist layer 106 can include a solder resist trench 112 along an inner perimeter 114 of a bottom side 116 of the conductive conformal shield structure 108. The solder resist trench 112 can extend continuously along the entirety of the inner perimeter 114 of the bottom side 116 of the conductive conformal shield structure 108. The solder resist trench 112 can be a continuous opening exposing a portion of the solder resist layer 106 around an outer perimeter 118 of the solder resist layer 106.

The conductive conformal shield structure 108 can be a conductive coating, such as a copper, zinc, silver, tin, an alloy, or conductive resin layer that is sprayed, plated, sputtered, printed, painted, laminated, or applied by physical vapor deposition (PVD), in contact with the solder resist layer 106 or spaced away from it leaving a substrate bottom layer 110 exposed. In an embodiment, the conductive conformal shield structure 108 can be exposed on the bottom side of the integrated circuit packaging system 100 and below the level of the substrate bottom layer 110.

It is understood that the number and position of the system interconnects 104 is an example only and the actual number and position can differ. By way of an example the integrated circuit packaging system 100 is shown as a square shape having an equal number of columns and rows of the system interconnects 104, but it is understood that the system interconnects 104 can form any pattern on the integrated circuit packaging system 100. A section line 2-2 can show the position and direction of view of the integrated circuit packaging system 100 in FIG. 2.

Figure 2:
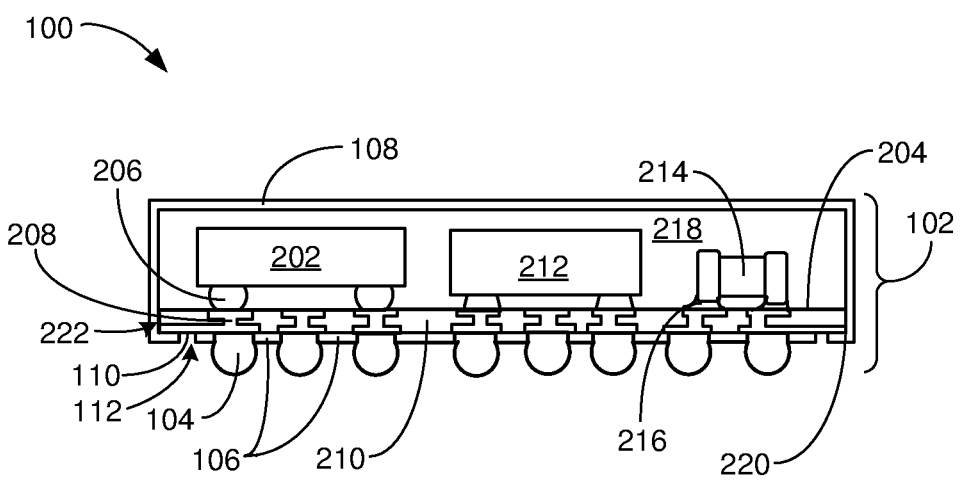
FIG. 2 is a cross-sectional view of the first embodiment of the integrated circuit packaging system along the section line 2-2 of FIG. 1.

Referring now to FIG. 2, therein is shown a cross-sectional view of the first embodiment of the integrated circuit packaging system 100 along the section line 2-2 of FIG. 1. The cross-sectional view of the first embodiment of the integrated circuit packaging system 100 depicts the integrated circuit package 102 having a first integrated circuit 202 with an active side coupled to a substrate top side 204 by chip interconnects 206, such as solder balls, solder bumps, stud bumps, or pillar interconnects. The first integrated circuit 202 can be electrically coupled to internal circuitry 208 of a substrate 210. The internal circuitry 208 can be contact pads, filled via interconnects, system interconnect pads, routing traces, discrete component pads, or a combination thereof. The internal circuitry 208 can form a redistribution layer within the substrate 210.

A second integrated circuit 212 and a discrete component 214 can be coupled to the substrate top side 204 by the chip interconnects 206 or a conductive adhesive 216, such as solder paste, conductive epoxy, conductive tape, or the like. The discrete component 214 can be a resistor, a capacitor, inductor, voltage regulator, diode, transistor, or the like. The second integrated circuit 212 can be an integrated circuit die, an integrated circuit package, an analog or hybrid circuit, a memory, or the like. A molded package body 218 can be formed directly on the first integrated circuit 202, the second integrated circuit 212, the discrete component 214, and the substrate top side 204.

The solder resist layer 106 can be formed directly on the substrate bottom side 110, the system interconnects 104, and the substrate internal circuitry 208. The solder resist layer 106 can extend all the way to the edge of the substrate bottom side 110 or can be spaced away from the edge leaving the substrate bottom 110 exposed.

The conductive conformal shield structure 108 can be formed directly on the molded package body 218, vertical sides 220 of the substrate 210 and the peripheral region of the substrate bottom side 110. The conductive conformal shield structure 108 can electrically connect to the internal circuitry 208 that extends to the vertical sides 220 of the substrate 210 or is exposed on the substrate bottom side 110. The conductive conformal shield structure 108 can extend below the substrate bottom side 110 and can extend horizontally below the substrate 210. The internal circuitry 208 can electrically connect the conductive conformal shield structure 108 to one of the system interconnects 104 that provides a connection to ground for the integrated circuit packaging system 100. The solder resist layer 106 can include the solder resist trench 112 exposing the substrate bottom 110. The solder resist trench 112 can be along an outer perimeter 222 of the substrate bottom side 110. The solder resist trench 112 can be offset inward from the conductive conformal shield structure 108.

It has been discovered that the integrated circuit package 102 can provide a thin and reliable platform for assembling multiple integrated circuits in a single package format that is shielded from EMI. The integrated circuit package 102 is able to be tested prior to further assembly and can represent a reliable and manufacturable package for maintaining the electrical integrity of the integrated circuit packaging system 100.

Figure 3:
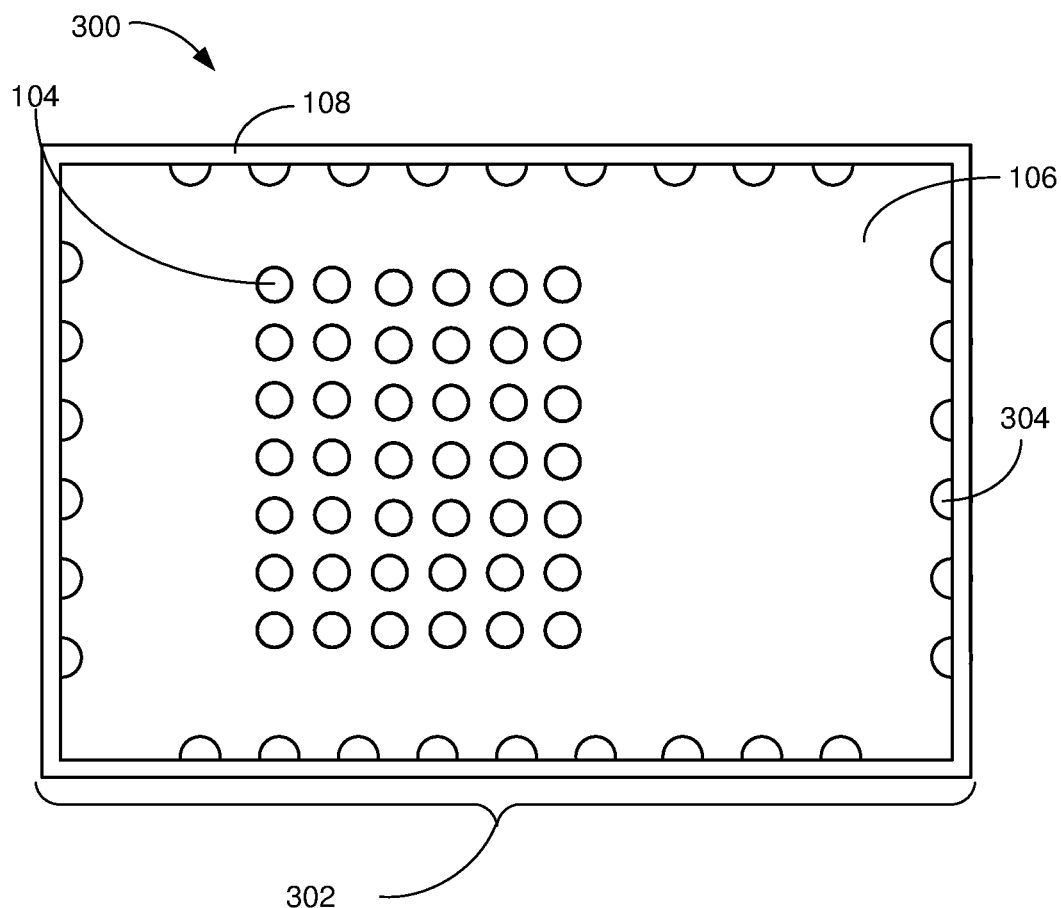
FIG. 3 is a bottom view of an integrated circuit packaging system in a second embodiment of the present invention.

Referring now to FIG. 3, therein is shown a bottom view of an integrated circuit packaging system 300 in a second embodiment of the present invention. The bottom view of a second embodiment 300 of the integrated circuit packaging system 100 depicts an integrated circuit package 302 including the system interconnects 104 positioned in a central region of the integrated circuit package 302. The solder resist 106 can be applied to the bottom of the integrated circuit package 302.

A plurality of plated through holes 304 can be aligned along each peripheral edges of the integrated circuit package 302. The plated through holes 304 can have a cylindrical center portion of a plated conductive material, such as copper, silver, tin, zinc, or an alloy thereof. The plurality of plated through holes 304 can each have a diameter sufficiently wide to remain after singulation, by way of an example the diameter can be in the range of 100 to 200 um and can provide at least 5 um after singulation. The top and bottom of the plated through holes 304 can extend beyond the cylindrical center portion for connecting the internal circuitry 208 of FIG. 2. The conductive conformal shield structure 108 can be formed to include the plated through holes 304.

It is understood that the position and number of the system interconnects 104 is an example only and the implemented number and position of the system interconnects 104 can be different. The positioning of the plurality of the plated through holes 304 is an example only, but the plurality of the plated through holes 304 will be along the saw street of the integrated circuit package 302.

Figure 4:
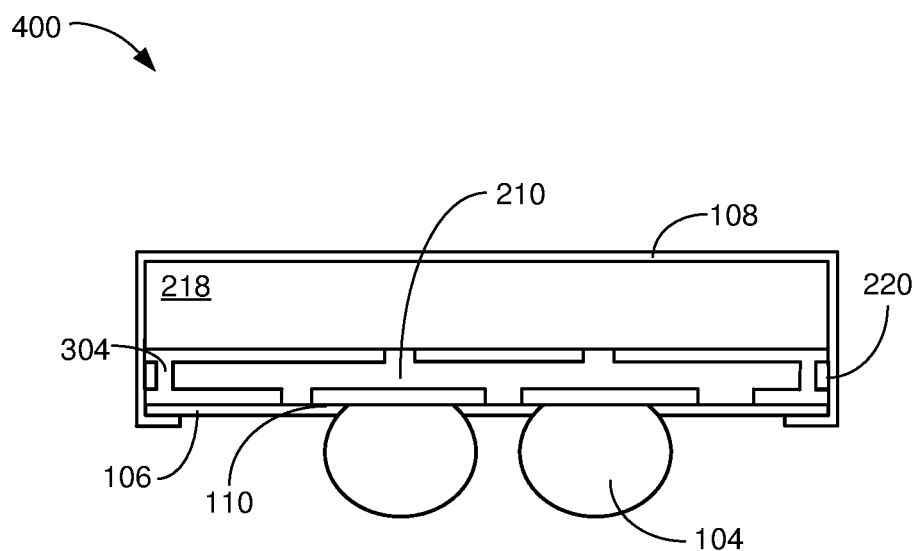
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The cross-sectional view of the integrated circuit packaging system 400 depicts the plated through holes 304 adjacent to the vertical sides 220 of the substrate 210. The solder resist 106 can cover the substrate bottom layer 110. The conductive conformal shield structure 108 can be formed on the molded package body 218 and can include the top and bottom of the plated through holes 304 because they are positioned directly on the saw street and present a solid conductive surface on the vertical sides 220 of the substrate 210. The conductive conformal shield structure 108 can include the top and bottom of the plated through holes 304 because they are electrically connected at the vertical sides 220 of the substrate 210.

The conductive conformal shield structure 108 can extend below the substrate bottom side 110 and make direct contact with the solder resist 106. The system interconnects 104 can be coupled to the substrate bottom side 110 and in contact with the solder resist 106. A portion of the conductive conformal shield structure 108 can extend across the solder resist 106 in order to provide a capture mechanism that can prevent peeling of the conductive conformal shield structure 108. It is understood that the conductive conformal shield structure 108 includes the plated through holes 304 because they are electrically connected at the vertical sides 220 of the substrate 210.

It is understood that any of the first integrated circuit 202 of FIG. 2, the second integrated circuit 212 of FIG. 2, and the discrete component 214 of FIG. 2 can be implemented in the integrated circuit packaging system 400. For clarity and ease of description, they are not shown.

It has been discovered that the conductive conformal shield structure 108 can be formed to include the plated through holes 304 in order to increase the electrical contacts within the conductive conformal shield structure 108. By increasing the number of the plated through holes 304 the structural integrity of the conductive conformal shield structure 108 can be increased.

Figure 5:
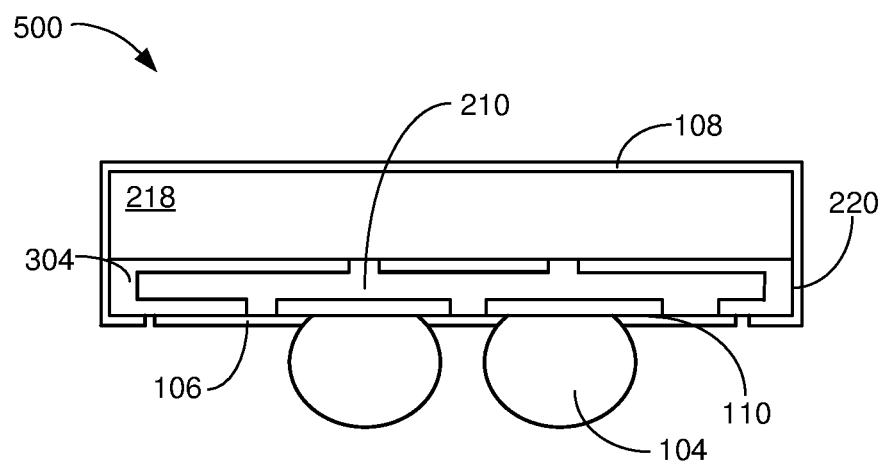
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The cross-sectional view of the integrated circuit packaging system 500 depicts the plated through holes 304 adjacent to the vertical sides 220 of the substrate 210. The solder resist 106 can cover the substrate bottom layer 110. The system interconnects 104 can be coupled to the substrate bottom side 110 and in contact with the solder resist 106. The conductive conformal shield structure 108 can be formed on the molded package body 218 and can include the plated through holes 304 because they are positioned directly on the saw street and present a solid conductive surface on the vertical sides 220 of the substrate 210. The plurality of plated through holes 304 can each have a diameter in the range of 100 to 200 um and after singulation at least 5 um will remain in place.

The conductive conformal shield structure 108 can extend below the substrate bottom side 110 and make direct contact with the substrate bottom side 110. A portion of the conductive conformal shield structure 108 can extend across the substrate bottom side 110 in order to provide a capture mechanism that can prevent peeling of the conductive conformal shield structure 108. It is understood that the conductive conformal shield structure 108 includes the plated through holes 304 because they are electrically connected at the vertical sides 220 of the substrate 210.

It is understood that any of the first integrated circuit 202 of FIG. 2, the second integrated circuit 212 of FIG. 2, and the discrete component 214 of FIG. 2 can be implemented in the integrated circuit packaging system 500. For clarity and ease of description, they are not shown.

It has been discovered that the conductive conformal shield structure 108 can be formed to include the plated through holes 304 in order to increase the electrical contacts within the conductive conformal shield structure 108. By increasing the number of the plated through holes 304 the structural integrity of the conductive conformal shield structure 108 can be increased.

Figure 6:
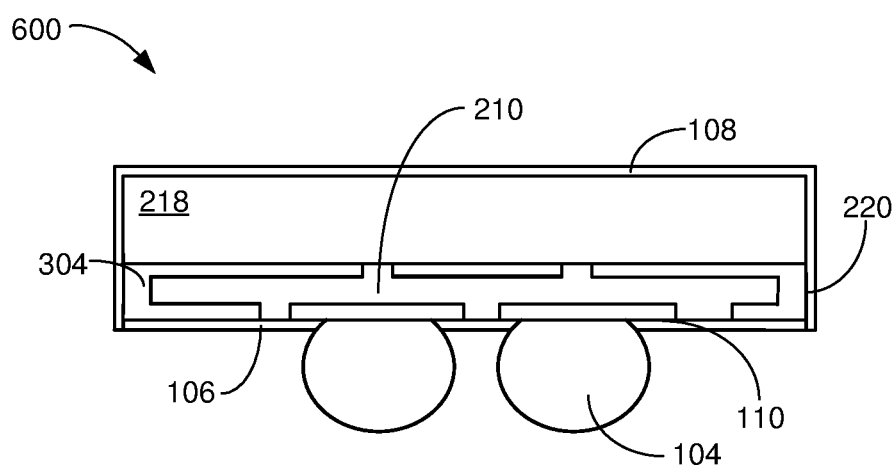
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. The cross-sectional view of the integrated circuit packaging system 600 depicts the plated through holes 304 adjacent to the vertical sides 220 of the substrate 210. The solder resist 106 can cover the substrate bottom layer 110. The system interconnects 104 can be coupled to the substrate bottom side 110 and in contact with the solder resist 106. The conductive conformal shield structure 108 can be formed on the molded package body 218 and can include the plated through holes 304 because they are positioned directly on the saw street and present a solid conductive surface on the vertical sides 220 of the substrate 210.

The conductive conformal shield structure 108 can extend below the substrate bottom side 110 and make direct contact with the solder resist 106. A portion of the conductive conformal shield structure 108 can extend across the substrate bottom side 110 in order to provide a capture mechanism that can prevent peeling of the conductive conformal shield structure 108. It is understood that the conductive conformal shield structure 108 includes the plated through holes 304 because they are electrically connected at the vertical sides 220 of the substrate 210.

It is understood that any of the first integrated circuit 202 of FIG. 2, the second integrated circuit 212 of FIG. 2, and the discrete component 214 of FIG. 2 can be implemented in the integrated circuit packaging system 600. For clarity and ease of description, they are not shown.

It has been discovered that the conductive conformal shield structure 108 can be formed to include the plated through holes 304 in order to increase the electrical contacts within the conductive conformal shield structure 108. By increasing the number of the plated through holes 304 the structural integrity of the conductive conformal shield structure 108 can be increased.

Figure 7:
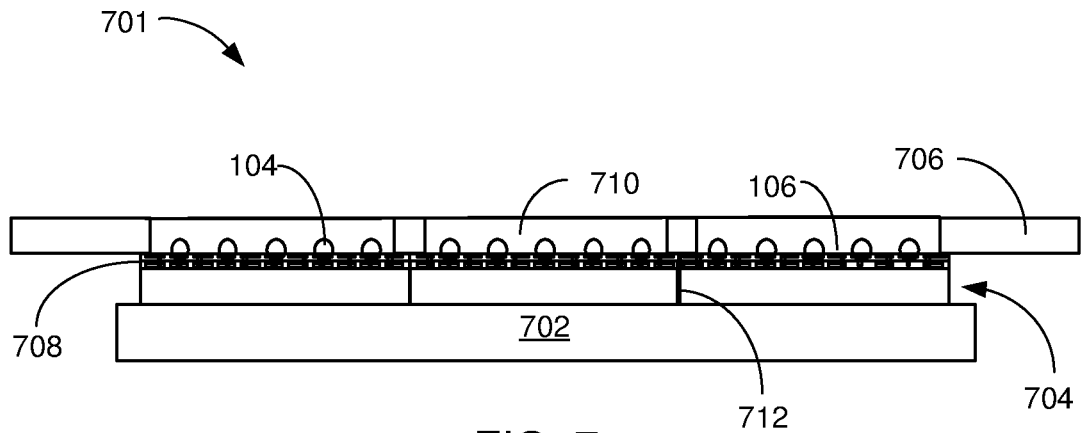
FIG. 7 is a cross-sectional view of a masking screen of the integrated circuit packaging system in a mask forming phase of manufacturing.

Referring now to FIG. 7, therein is shown a cross-sectional view of a masking screen 701 of the integrated circuit packaging system 100 in a mask forming phase of manufacturing. The cross-sectional view of the masking screen 701 of the integrated circuit packaging system 100 depicts a carrier 702 having a molded package strip 704 mounted thereon. The carrier 702 can be composed of metal, ceramic, plastic, fiber, glass, or the like. The molded package strip 704 can have the system interconnects 104 and the solder resist 106 facing away from the carrier 702.

A printing screen 706 can be positioned on a wafer substrate 708. The printing screen 706 can be used to pattern an interconnect mask 710, such as a paste, a film, a silicone epoxy or a curable heat resistant material. The printing screen 706 can block the distribution of the interconnect mask 710 around the saw streets 712 of the molded package strip 704. The positioning of the printing screen 706 can allow access of a singulation saw (not shown) over the saw streets 712 and a fixed dimension adjacent to the saw streets 712.

It has been discovered that the printing screen 706 can define the horizontal extension dimensions of the conductive conformal shield structure 108 of FIG. 1 in a mass production environment. The dimensions are predictable and repeatable.

Figure 8:
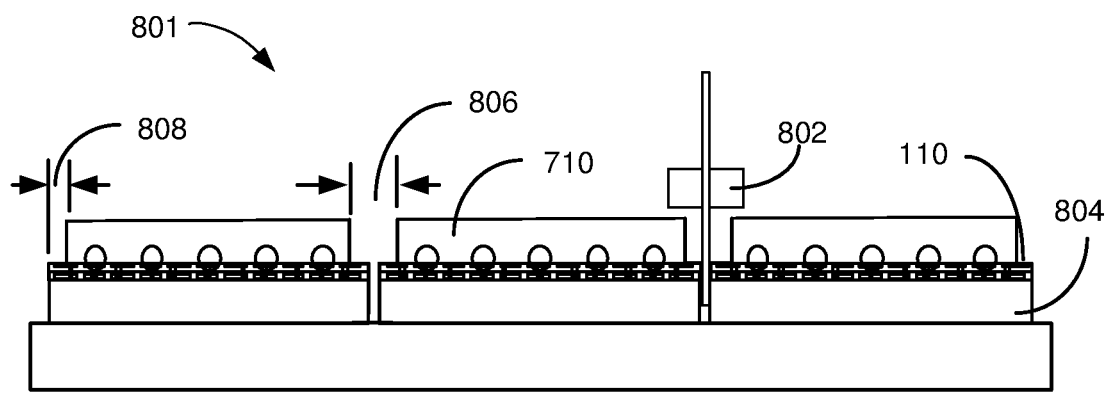
FIG. 8 is a cross-sectional view of a singulation structure of the integrated circuit packaging system in a package sawing phase of manufacturing.

Referring now to FIG. 8, therein is shown a cross-sectional view of a singulation structure 801 of the integrated circuit packaging system 100 in a package sawing phase of manufacturing. The cross-sectional view of the singulation structure 801 of the integrated circuit packaging system 100 depicts a singulation saw 802 having separated integrated package assemblies 804 from the molded package strip 704 of FIG. 7.

A mask spacing 806 can establish the width of the saw street 712 of FIG. 7 and a horizontal overlap distance 808, which can be greater than or equal to 10 um of horizontal spacing on the substrate bottom side 110. It is understood that some of the embodiments can eliminate the mask spacing 806 and saw directly through the interconnect mask 710. In these embodiments, the conductive conformal shield structure 108 of FIG. 1 can abut the solder resist 106 of FIG. 1 where it extends below the substrate bottom side 110.

Figure 9:
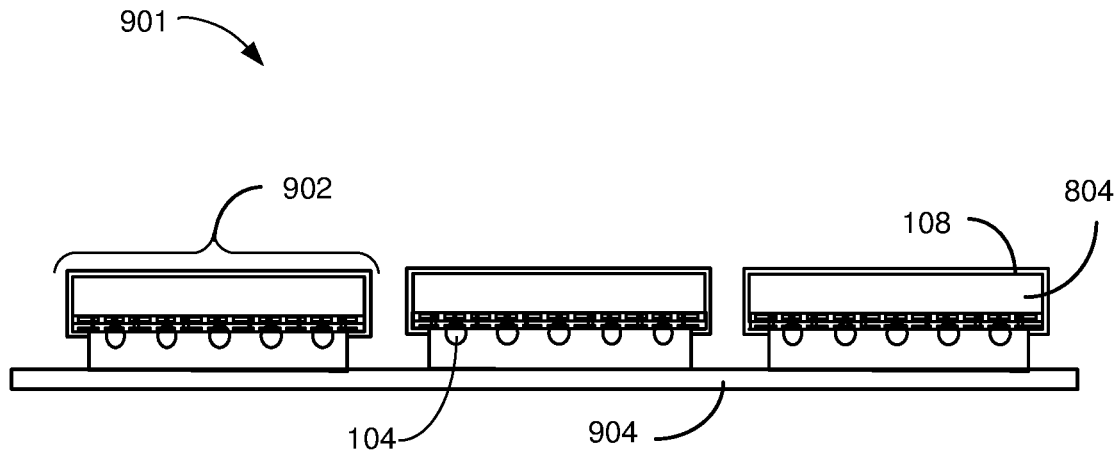
FIG. 9 is a cross-sectional view of a package assembly array of an integrated circuit package assembly in an application phase of manufacturing.

Referring now to FIG. 9, therein is shown a cross-sectional view of a package assembly array 901 of an integrated circuit package assembly 902 in an application phase of manufacturing. The cross-sectional view of the package assembly array 901 depicts the integrated package assemblies 804 having been transferred to a deposition tape 904. The deposition tape 904 can position the integrated circuit package assembly 902 so that the conductive conformal shield structure 108 can be formed on all of the exposed surfaces. FIG. 9 shows the integrated circuit package assembly 902 is attached to the deposition tape 904 with the interconnect mask 710 directly on the deposition tape 904. The deposition tape 904 can be a polyimide layer or other heat resistant adhesive layer for maintaining the position of the integrated package assemblies 804 during the coating process to apply the conductive conformal shield structure 108. It is understood that the conductive conformal shield structure 108 can be applied by way of spraying, plating, sputtering, printing, painting, laminating, or by physical vapor deposition (PVD).

It is understood that the vertical sides 220 of FIG. 2 of the substrate 210 of FIG. 2 can have metal layers exposed by the singulation saw 802 having separated the integrated package assemblies 804 from the molded package strip 704 of FIG. 7. The conductive conformal shield structure 108 can form a direct physical and electrical connection to the exposed portions of the vertical sides 220 or exposed portions of the substrate bottom side 110. The physical and electrical connection of the conductive conformal shield structure 108 can prevent peeling or damage to the conductive conformal shield structure 108 during handling and assure a secure and quality device.

It has been discovered that the integrated circuit package assembly 902 can prevent contamination of the system interconnects 104 during the application of the conductive conformal shield structure 108. If the conductive conformal shield structure 108 were to contaminate the system interconnects 104, the integrated circuit package 102 of FIG. 1 could fail the manufacturing tests and be rejected. By implementing the integrated circuit package assembly 902, the system interconnects 104 are protected from contamination and possible short circuits.

Figure 10:
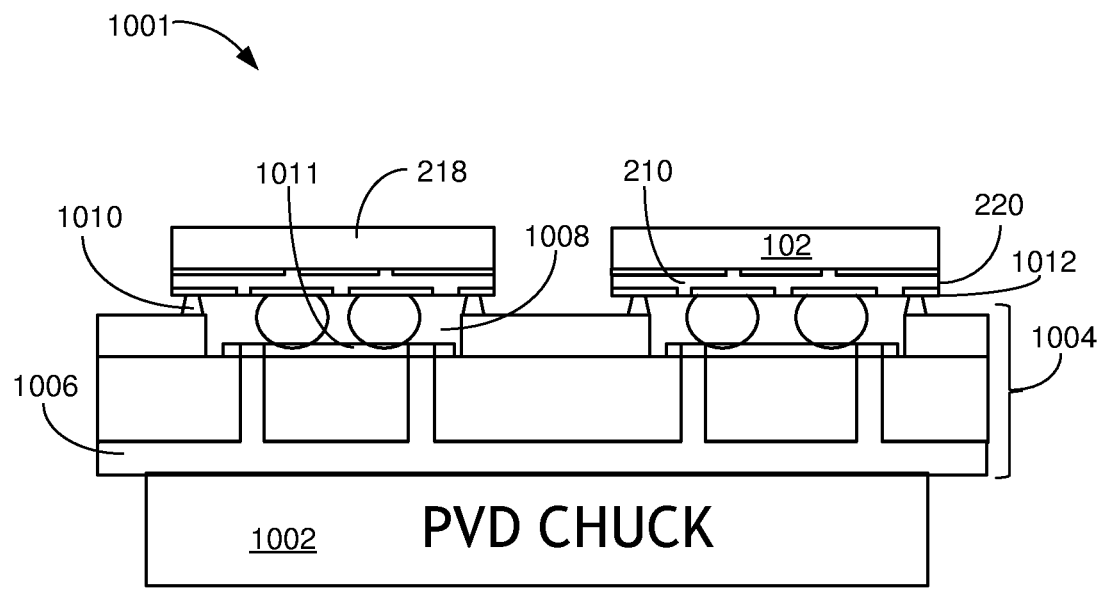
FIG. 10 is a cross-sectional view of a physical vapor deposition (PVD) manufacturing tool of the integrated circuit packaging system.

Referring now to FIG. 10, therein is shown a cross-sectional view of a physical vapor deposition (PVD) manufacturing tool 1001 of the integrated circuit packaging system 100 of FIG. 1. The cross-sectional view of the PVD manufacturing tool 1001 depicts a PVD chuck 1002 supporting a PVD chip carrier 1004 having a vacuum chucking mechanism 1006.

The vacuum chucking mechanism 1006 can have multiple vacuum chambers 1008 with an adhesive dam 1010 mounted on its periphery. The adhesive dam 1010 can seal on the integrated circuit package 102 to form a vacuum seal.

The adhesive dam 1010 is positioned to expose a periphery 1012 of the substrate bottom side 110 outside the vacuum chambers 1008. The vacuum chambers 1008 can include an interconnect adhesive 1011, such as a compliant polymer with good mechanical and heat resistance. The pressure within the vacuum chamber 1008 can be reduced prior to the PVD process in order to lock the integrated circuit package 102 in position on the adhesive dam 1010. In an embodiment the vacuum chamber 1008 can be maintained at the same pressure as the PVD chamber (not shown) in order to avoid a pressure differential that could defeat the adhesive dam 1010.

The PVD chuck 1002 can be placed in a PVD chamber (not shown) that can deposit the conductive conformal shield structure 108 on all of the exposed surfaces of the integrated circuit package 102. The conductive conformal shield structure 108 can be formed directly on the top of the molded package body 218, vertical sides 220 of the substrate 210, and the periphery 1012 of the substrate bottom side 110.

It has been discovered that the physical vapor deposition (PVD) manufacturing tool 1001 can repeatedly produce the conductive conformal shield structure 108 on the integrated circuit package 102 in high volume. By positioning the adhesive dam 1010 relative to the interconnect adhesive 1011, the accurate dimensions of the periphery 1012 can be controlled to prevent contamination to the system interconnects 104.

Figure 11:
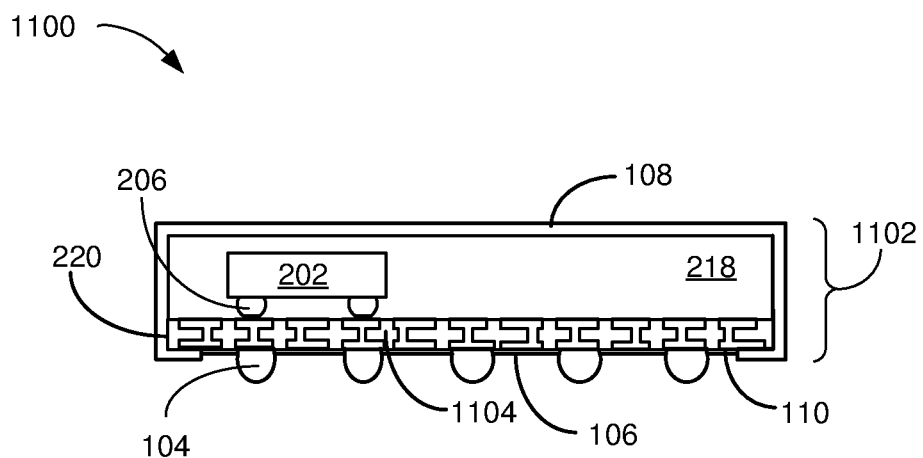
FIG. 11 is a cross-sectional view of an integrated circuit packaging system in a sixth embodiment of the present invention.

Referring now to FIG. 11, therein is shown a cross-sectional view of an integrated circuit packaging system 1100 in a sixth embodiment of the present invention. The cross-sectional view of the integrated circuit packaging system 1100 includes an integrated circuit package 1102. The integrated circuit package 1102 can have the first integrated circuit 202 coupled to a multi-layer substrate 1104 through the chip interconnects 206. The molded package body 218 can be formed directly on the first integrated circuit 202, the chip interconnects 206, and the multi-layer substrate 1104.

The conductive conformal shield structure 108 can be formed on the molded package body 218, the vertical side 220, and the substrate bottom side 110. In the integrated circuit packaging system 1100, the vertical sides 220 of the multi-layer substrate 1104 have no exposed metal. By applying the conductive conformal shield structure 108 across the substrate bottom side 110 a physical and electrical connection can be made. The system interconnects 104 can be coupled to the substrate bottom side 110 and in contact with the solder resist 106. The attachment of the conductive conformal shield structure 108 to the substrate bottom side 110 can prevent peeling of the conductive conformal shield structure 108 and assure a reliable and manufacturable device of the integrated circuit packaging system 1100. The conductive conformal shield structure 108 can extend across the substrate bottom side 110 greater than or equal to 10 um for making an electrical connection.

Figure 12:
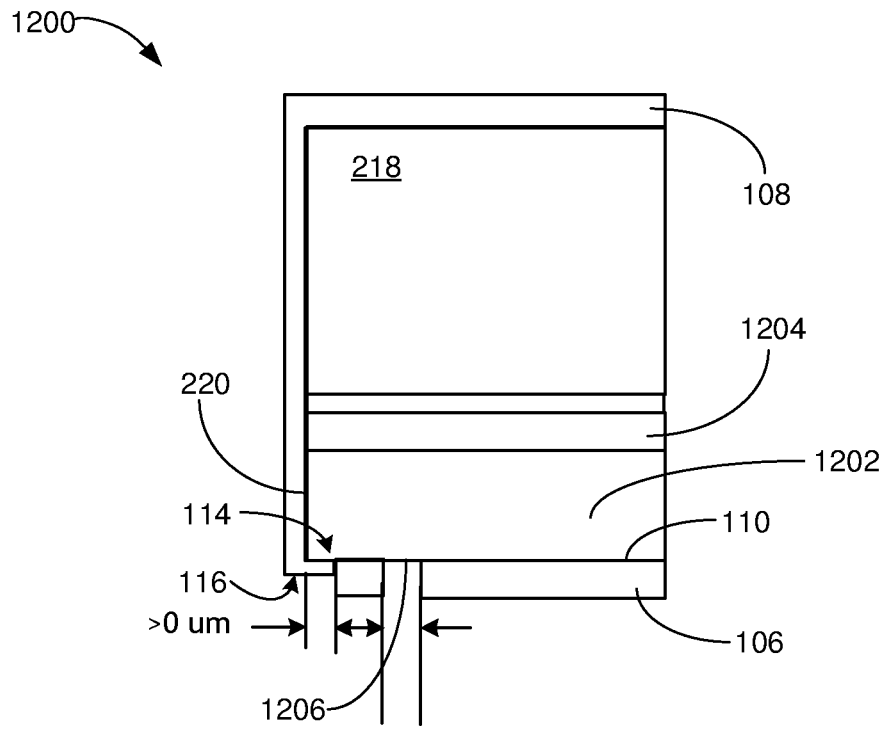
FIG. 12 is a cross-sectional view of an integrated circuit packaging system in a seventh embodiment of the present invention.

Referring now to FIG. 12, therein is shown a cross-sectional view of an integrated circuit packaging system 1200 in a seventh embodiment of the present invention. The cross-sectional view of the integrated circuit packaging system 1200 depicts a layered substrate 1202 having a top inner layer 1204 coupled to the conductive conformal shield structure 108. The solder resist 106 can cover the substrate bottom layer 110. The conductive conformal shield structure 108 can be formed on the molded package body 218 and the vertical sides 220 of the layered substrate 1202 to include the top inner layer 1204 because the top inner layer 1204 is positioned directly on the saw street and presents a solid conductive surface on the vertical sides 220 of the layered substrate 1202.

The conductive conformal shield structure 108 can extend below the substrate bottom side 110 and make direct contact with the substrate bottom side 110. A portion of the conductive conformal shield structure 108 can extend across the substrate bottom side 110 in order to provide a capture mechanism that can prevent peeling of the conductive conformal shield structure 108. It is understood that the conductive conformal shield structure 108 includes the top inner layer 1204 because it is electrically connected at the vertical sides 220 of the layered substrate 1202.

The conductive conformal shield structure 108 can contact the solder resist 106 near the vertical sides 220, where the conductive conformal shield structure 108 can extend across the substrate bottom side 110 for a distance of greater than or equal to 10 um. A solder resist trench 1206 can be positioned at least 10 um from the end of the horizontal portion of the conductive conformal shield structure 108. The solder resist trench 1206 can penetrate all the way to the substrate bottom side 110 and have a width of greater than or equal to 10 um. The solder resist trench 1206 can enhance the adhesion of the adhesive dam 1010 of FIG. 10 in order to prevent the conductive conformal shield structure 108 from spreading beyond its intended coverage. The solder resist trench 1206 can expose the substrate bottom side 110. The solder resist trench 1206 can be along the inner perimeter 114 of the bottom side 116 of the conductive conformal shield structure 108. The solder resist trench 1206 can be offset inward from the conductive conformal shield structure 1206.

It is understood that any of the first integrated circuit 202 of FIG. 2, the second integrated circuit 212 of FIG. 2, and the discrete component 214 of FIG. 2 can be implemented in the integrated circuit packaging system 1200. For clarity and ease of description, they are not shown.

It has been discovered that the conductive conformal shield structure 108 can be formed to include the top inner layer 1204 in order to increase the electrical contacts within the conductive conformal shield structure 108. By increasing the number of connections of the top inner layer 1204 the structural integrity of the conductive conformal shield structure 108 can be increased.

Figure 13:
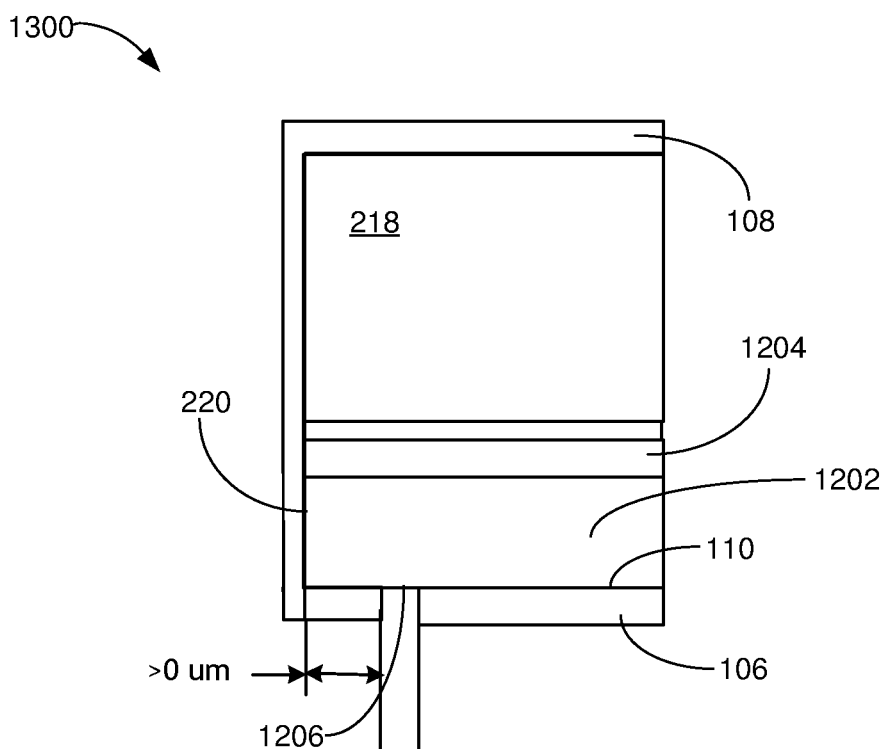
FIG. 13 is a cross-sectional view of an integrated circuit packaging system in an eighth embodiment of the present invention.

Referring now to FIG. 13, therein is shown a cross-sectional view of an integrated circuit packaging system 1300 in an eighth embodiment of the present invention. The cross-sectional view of the integrated circuit packaging system 1300 depicts a layered substrate 1202 having a top inner layer 1204 coupled to the conductive conformal shield structure 108. The solder resist 106 can cover the substrate bottom layer 110. The conductive conformal shield structure 108 can be formed on the molded package body 218 and the vertical sides 220 of the layered substrate 1202 to include the top inner layer 1204 because the top inner layer 1204 is positioned directly on the saw street and presents a solid conductive surface on the vertical sides 220 of the layered substrate 1202.

The conductive conformal shield structure 108 can extend below the substrate bottom side 110 and make direct contact with the solder resist 106. It is understood that the conductive conformal shield structure 108 includes the top inner layer 1204 because it is electrically connected at the vertical sides 220 of the layered substrate 1202. The conductive conformal shield structure 108 can abut the solder resist 106 near the vertical sides 220, where the conductive conformal shield structure 108 can extend along the substrate bottom side 110 for a distance of greater than 0 um.

The conductive conformal shield structure 108 can extend below the substrate bottom side 110 for a distance of greater than 0 um. A solder resist trench 1206 can be positioned at least 10 um from the edge of the conductive conformal shield structure 108. The solder resist trench 1206 can penetrate all the way to the substrate bottom side 110 and have a width of greater than or equal to 10 um. The solder resist trench 1206 can enhance the adhesion of the adhesive dam 1010 of FIG. 10 in order to prevent the conductive conformal shield structure 108 from spreading beyond its intended coverage.

It is understood that any of the first integrated circuit 202 of FIG. 2, the second integrated circuit 212 of FIG. 2, and the discrete component 214 of FIG. 2 can be implemented in the integrated circuit packaging system 1300. For clarity and ease of description, they are not shown.

It has been discovered that the conductive conformal shield structure 108 can be formed to include the top inner layer 1204 in order to increase the electrical contacts within the conductive conformal shield structure 108. By increasing the number of connections of the top inner layer 1204 the structural integrity of the conductive conformal shield structure 108 can be increased.

Figure 14:
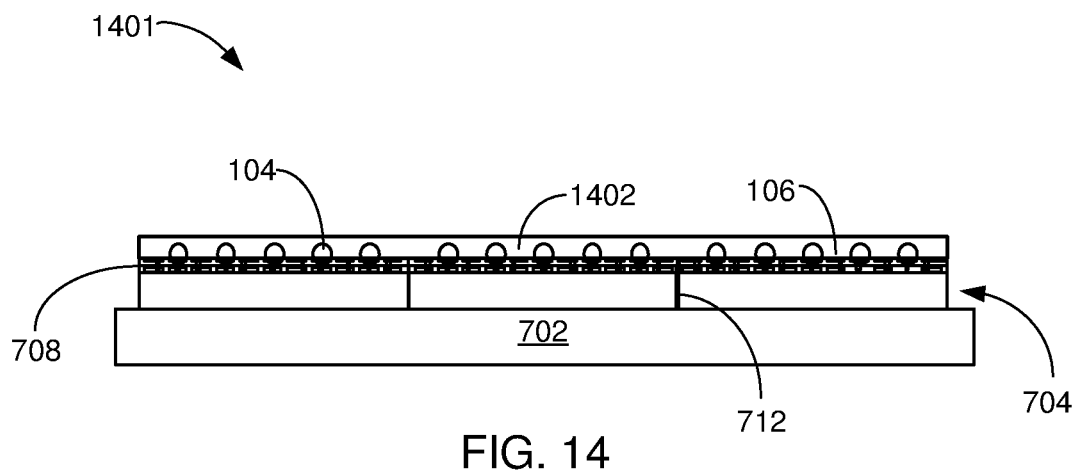
FIG. 14 is a cross-sectional view of an interconnect encasing of the integrated circuit packaging system in a system interconnect encasing phase of manufacturing.

Referring now to FIG. 14, therein is shown a cross-sectional view of an interconnect encasing 1401 of the integrated circuit packaging system 100 in a system interconnect encasing phase of manufacturing. The cross-sectional view of the interconnect encasing 1401 of the integrated circuit packaging system 100 depicts the carrier 702 having the molded package strip 704 mounted thereon. The carrier 702 can be composed of metal, ceramic, plastic, fiber, glass, or the like. The molded package strip 704 can include the system interconnects 104 and the solder resist 106 applied to the wafer substrate 708 facing away from the carrier 702.

An interconnect encasing layer 1402, such as a paste, a film, a silicone epoxy or a curable heat resistant material, can be formed on the the system interconnects 104 and the solder resist 106 of the wafer substrate 708. The interconnect encasing layer 1402 covers the saw streets 712 of the molded package strip 704.

It has been discovered that the interconnect encasing layer 1402 can provide a protection layer for the system interconnects 104 during handling. The interconnect encasing layer 1402 can completely encase all exposed surfaces of the system interconnects 104 and the solder resist 106.

Figure 15:
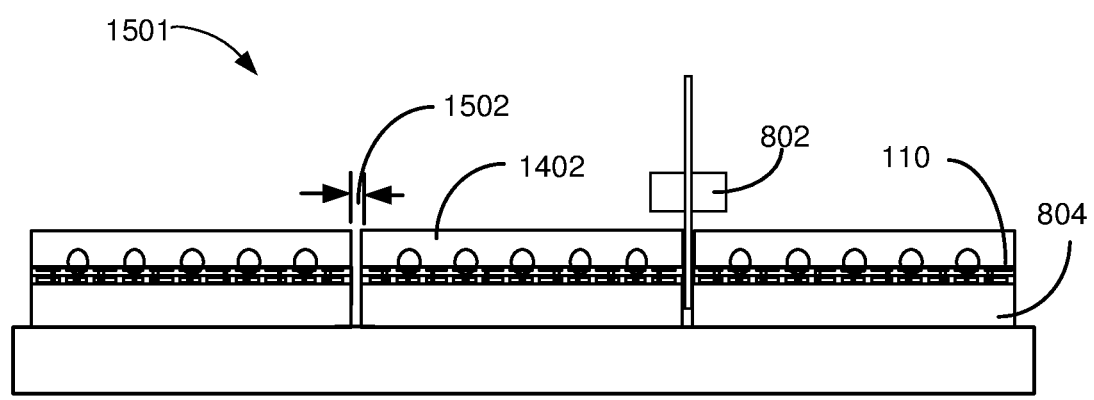
FIG. 15 is a cross-sectional view of a singulation structure of the integrated circuit packaging system in a package sawing phase of manufacturing.

Referring now to FIG. 15, therein is shown a cross-sectional view of a singulation structure 1501 of the integrated circuit packaging system 100 of FIG. 1 in a package sawing phase of manufacturing. The cross-sectional view of the singulation structure 1501 of the integrated circuit packaging system 100 depicts the singulation saw 802 having separated integrated package assemblies 804 from the molded package strip 704 of FIG. 7.

A saw street spacing 1502 can establish the width of the saw street 712 of FIG. 7. It is understood that some of the embodiments can saw directly through the interconnect encasing layer 1402. In this embodiment, the conductive conformal shield structure 108 of FIG. 1 can abut the solder resist 106 of FIG. 1 where it extends below the substrate bottom side 110.

Figure 16:
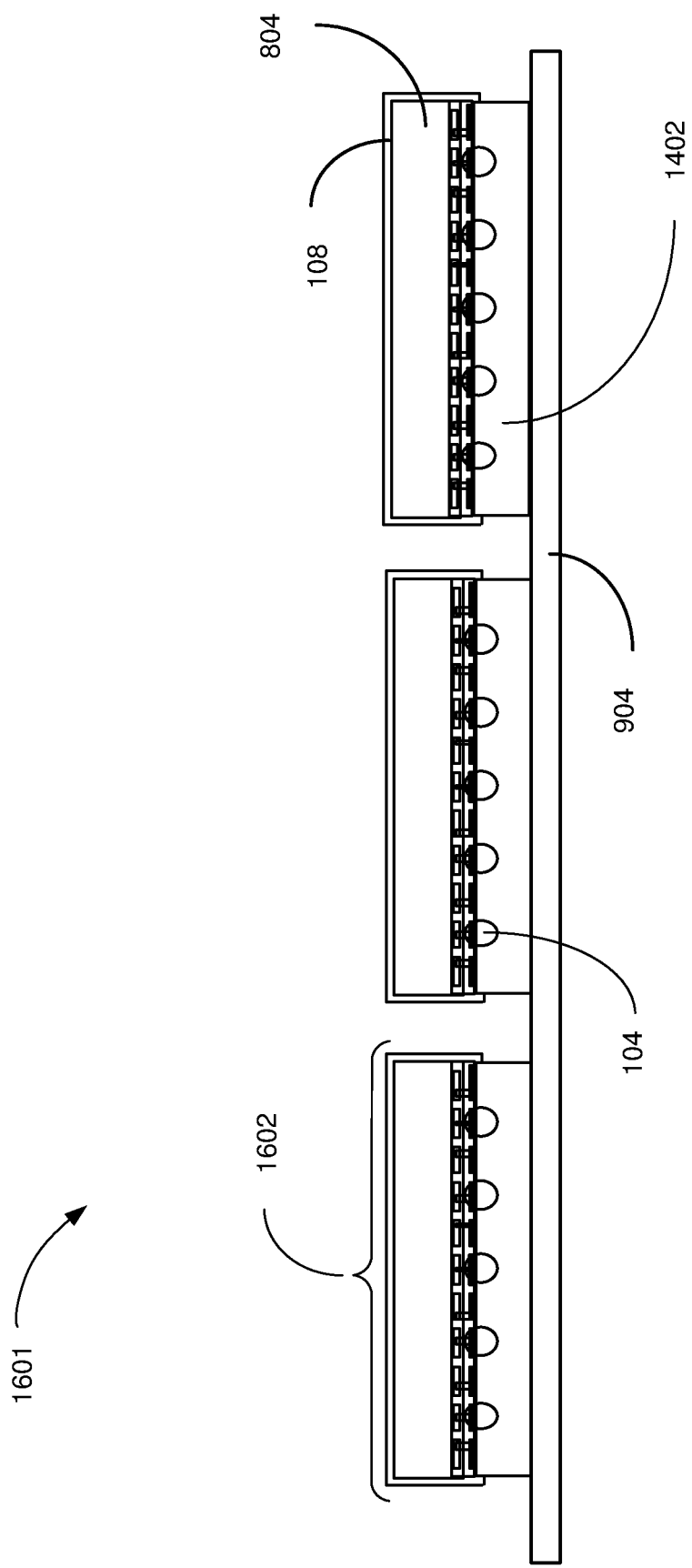
FIG. 16 is a cross-sectional view of a package assembly array of an integrated circuit package assembly in an application phase of manufacturing.

Referring now to FIG. 16, therein is shown a cross-sectional view of a package assembly array 1601 of an integrated circuit package assembly 1602 in an application phase of manufacturing. The cross-sectional view of the package assembly array 1601 depicts the integrated package assemblies 804 having been transferred to the deposition tape 904. The deposition tape 904 can position the integrated circuit package assembly 1602 so that the conductive conformal shield structure 108 can be formed on all of the exposed surfaces. The deposition tape 904 can be a polyimide layer or other heat resistant adhesive layer for maintaining the position of the integrated package assemblies 804 during the coating process to apply the conductive conformal shield structure 108. It is understood that the conductive conformal shield structure 108 can be applied by way of spraying, plating, sputtering, printing, painting, laminating, or by physical vapor deposition (PVD).

It is understood that the vertical sides 220 of FIG. 2 of the substrate 210 of FIG. 2 can have metal layers exposed by the singulation saw 802 having separated the integrated package assemblies 804 from the molded package strip 704 of FIG. 7. The conductive conformal shield structure 108 can form a direct physical and electrical connection to the exposed portions of the vertical sides 220. The physical and electrical connection of the conductive conformal shield structure 108 can prevent peeling or damage to the conductive conformal shield structure 108 during handling and assure a secure and quality device.

It has been discovered that the integrated circuit package assembly 1602 can prevent contamination of the system interconnects 104 during the application of the conductive conformal shield structure 108 because they are completely encased by the interconnect encasing layer 1402. If the conductive conformal shield structure 108 were to contaminate the system interconnects 104, the integrated circuit package 102 of FIG. 1 could fail the manufacturing tests and be rejected. By implementing the integrated circuit package assembly 1602, the system interconnects 104 are protected from contamination and possible short circuits.

Figure 17:
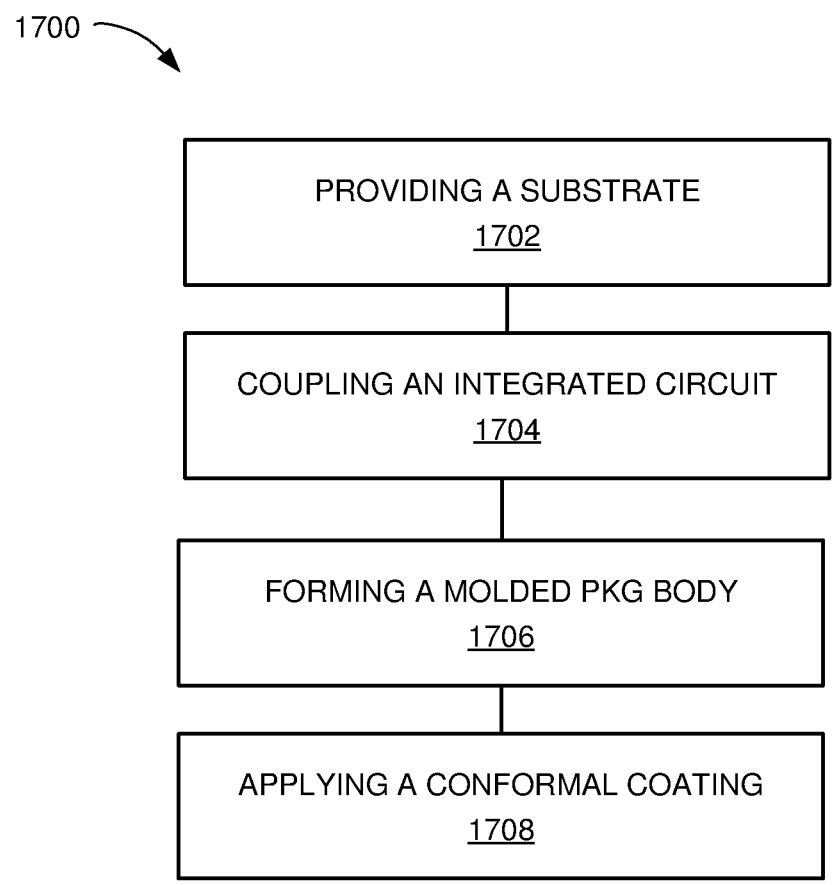
FIG. 17 is a flow chart of a method of manufacture of an integrated circuit packaging system in a further embodiment of the present invention.

Referring now to FIG. 17, therein is shown a flow chart of a method 1700 of manufacture of an integrated circuit packaging system 100 in a further embodiment of the present invention. The method 1700 includes: providing a substrate with internal circuitry between a substrate top side, a substrate bottom side, and vertical sides in a block 1702; coupling an integrated circuit to the internal circuitry in a block 1704; forming a molded package body directly on the integrated circuit and the substrate top side of the substrate in a block 1706; and applying an conductive conformal shield structure directly on the molded package body, the vertical sides, and extending below the substrate bottom side for coupling the internal circuitry in a block 1708.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   forming a molded package strip on a carrier, the molded package strip having system interconnects and a solder resist layer mounted over a wafer substrate with the wafer substrate coupled to the system interconnects;
   forming an interconnect encasing on the system interconnects and the solder resist layer, the interconnect encasing encases the system interconnects;
   singulating the molded package strip to form an integrated package assembly by cutting along a saw street of the molded package strip to expose vertical sides of the integrated package assembly; and
   applying a conductive conformal shield structure directly on the integrated package assembly and the interconnect encasing.

2. A method of manufacture of an integrated circuit packaging system comprising:
   forming a molded package strip on a carrier, the molded package strip having system interconnects and a solder resist layer mounted over a wafer substrate, the wafer substrate coupled to the system interconnects, and the system interconnects and the solder resist layer are both facing away from the molded package strip;
   forming an interconnect encasing on the system interconnects and the solder resist layer, the interconnect encasing encases the system interconnects;
   singulating the molded package strip to form an integrated package assembly by cutting along a saw street of the molded package strip to expose vertical sides of the integrated package assembly;
   transferring the integrated package assembly to a deposition tape, the interconnect encasing positioned directly on the deposition tape; and
   applying a conductive conformal shield structure directly on the integrated package assembly and the interconnect encasing.

3. An integrated circuit packaging system comprising:
   an integrated package assembly comprising:
     a molded package strip having system interconnects and a solder resist layer mounted over a wafer substrate with the wafer substrate coupled to the system interconnects; and
     an interconnect encasing on the system interconnects and the solder resist layer, the interconnect encasing encases the system interconnects; and
   a conductive conformal shield structure directly on the integrated package assembly, the interconnect encasing, and the vertical sides of the integrated package assembly.

4. The method as claimed in claim 1 further comprising forming plated through holes in the integrated package assembly and exposing the plated through holes at the vertical sides.

5. The method as claimed in claim 1 further comprising:
   forming plated through holes in the integrated package assembly;
   exposing the plated through holes at the vertical sides; and
   electrically connecting the plated though holes to the conductive conformal shield structure between the wafer substrate and the solder resist layer.

6. The method as claimed in claim 1 wherein applying the conductive conformal shield structure includes electrically connecting the conductive conformal shield structure to an internal conductive layer.

7. The method as claimed in claim 2 wherein singulating the integrated package assembly includes forming plated through holes at a saw street and exposing the plated through holes with a singulation saw.

8. The method as claimed in claim 2 wherein applying the conductive conformal shield structure includes forming the conductive conformal shield structure offset from the solder resist layer.

9. The system as claimed in claim 3 further comprising plated through holes in the integrated package assembly exposed at the vertical sides of the integrated package assembly.

10. The system as claimed in claim 3 further comprising plated through holes in the integrated package assembly exposed on the vertical sides of the integrated package assembly and electrically coupled to the conductive conformal shield structure between the wafer substrate and the solder resist layer.

11. The system as claimed in claim 3 further comprising an internal conductive layer electrically connecting the conductive conformal shield structure.

12. The system as claimed in claim 3 wherein the system interconnects and the solder resist layer are both facing away from the molded package strip.

13. The system as claimed in claim 12 further comprising plated through holes having a diameter of at least 5 micrometers (um) at a vertical edge of the integrated package assembly.

14. The system as claimed in claim 12 further comprising plated through holes exposed at a vertical edge of the integrated package assembly.

15. The system as claimed in claim 12 wherein the conductive conformal shield structure is offset from the solder resist layer.

16. The method as claimed in claim 2 wherein singulating an integrated package assembly includes cutting the plated through holes.

* * * * *